(12) United States Patent
Tan et al.

(10) Patent No.: US 7,833,888 B2
(45) Date of Patent: Nov. 16, 2010

(54) INTEGRATED CIRCUIT SYSTEM EMPLOYING GRAIN SIZE ENLARGEMENT

(75) Inventors: Chung Foong Tan, Singapore (SG); Jae Gon Lee, Singapore (SG); Lee Wee Teo, Singapore (SG); Elgin Kiok Boone Quek, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 12/116,156

(22) Filed: May 6, 2008

(65) Prior Publication Data
US 2009/0280629 A1 Nov. 12, 2009

(51) Int. Cl.
*H01L 21/425* (2006.01)

(52) U.S. Cl. ............... 438/514; 438/766; 438/197; 438/199; 257/E21.632

(58) Field of Classification Search ............... 438/766, 438/514, 197, 199, 230, 301, 303, 483; 257/E21.632
See application file for complete search history.

(56) References Cited

U.S. PATENT DOCUMENTS

| 7,101,743 B2 * | 9/2006 | Li et al. ............. 438/197 |
| 2002/0070388 A1 * | 6/2002 | Greenberg et al. ......... 257/122 |
| 2006/0270217 A1 | 11/2006 | Balseanu et al. |
| 2007/0099370 A1 | 5/2007 | Nakajima et al. |
| 2008/0026572 A1 | 1/2008 | Wirbeleit et al. |
| 2009/0032877 A1 * | 2/2009 | Visokay et al. ............. 257/368 |

* cited by examiner

*Primary Examiner*—Ha Tran T Nguyen
*Assistant Examiner*—Aaron A Dehne
(74) *Attorney, Agent, or Firm*—Mikio Ishimaru

(57) ABSTRACT

An integrated circuit system that includes: providing a substrate including an active device with a gate top surface exposed; implanting a do pant within the gate to alter the grain size of the gate material; forming a dielectric layer over the active device and the substrate; and annealing the integrated circuit system to transfer the stress of the dielectric layer into the active device.

20 Claims, 4 Drawing Sheets

INTEGRATED CIRCUIT SYSTEM EMPLOYING GRAIN SIZE ENLARGEMENT

TECHNICAL FIELD

The present invention relates generally to integrated circuits, and more particularly to an integrated circuit system employing grain size enlargement.

BACKGROUND ART

Integrated circuits find application in many of today's consumer electronics, such as cell phones, video cameras, portable music players, printers, computers, etc. Integrated circuits may include a combination of active devices, passive devices and their interconnections.

Recent technological advances in integrated circuits have been proposed for enhancing the channel conductivity of active devices by increasing the charge carrier mobility within the channel region of each device. One efficient mechanism for increasing the charge carrier mobility within a channel region is through the modification of the lattice structure in the channel region, for instance, by creating tensile or compressive stress in the vicinity of the channel region so as to produce a corresponding strain in the channel region, which results in a modified mobility for electrons and holes, respectively.

In some approaches, a substantially amorphized region may be formed adjacent to a gate electrode at an intermediate manufacturing stage, which may then be re-crystallized in the presence of a stressed layer formed above the active device area. During the anneal process for re-crystallizing the lattice, the amorphous or lattice damaged region can re-crystallize under the stress created by a strained overlayer, thereby resulting in a strained crystalline orientation. After the re-crystallization anneal, the sacrificial stress layer may be removed, wherein nevertheless a certain amount of strain may be retained within the re-grown lattice portion. This effect is generally known as stress memorization. Unfortunately, previous methodologies for enhancing or increasing this stress memorization transfer effect have caused unacceptable damage to the active device structure, thereby rendering the device unreliable and/or inoperable.

Thus, a need still remains for a reliable integrated circuit system and method of fabrication, wherein the integrated circuit system exhibits further device performance improvement via the application of an enhanced stress memorization transfer technique. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate including an active device with a gate top surface exposed; implanting a dopant within the gate to alter the grain size of the gate material; forming a dielectric layer over the active device and the substrate; and annealing the integrated circuit system to transfer the stress of the dielectric layer into the active device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
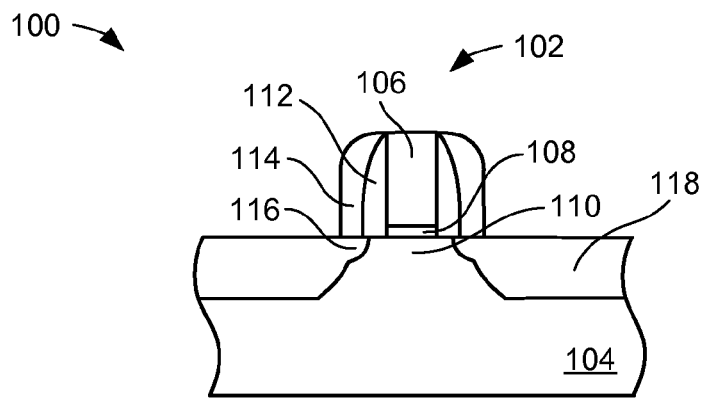
FIG. 1 is a partial cross sectional view of an integrated circuit system in an initial stage of manufacture in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The term "layer" encompasses both the singular and the plural unless otherwise indicated.

The term "exhibiting the characteristics of stress memorization" as used herein includes a structure or element that has its physical properties affected by a stress memorization layer.

The term "active device" is used herein to mean a fully functioning and operable device that can increase the magnitude of a given electrical input parameter by merely establishing electrical contacts.

The term "system" as used herein means and refers to the method and to the apparatus of the present invention in accordance with the context in which the term is used.

Generally, the following embodiments relate to the formation of an integrated circuit system including an amorphous region created by a selective implantation process. By forming the amorphous region via the processes described herein, the grain size of the implanted region can be increased, thereby improving the stress transfer efficiency of a subsequently applied stress memorization layer. The system and methods described herein have been to shown to cause a shift in the $I_{on}/I_{off}$ curve that increases the drive current without adversely impacting or increasing the leakage current of the integrated circuit system.

FIGS. 1-12, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-12. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of multi-electrode devices (e.g., active device structures) in which the current flowing between two specified electrodes is controlled or modulated by the voltage applied at a control electrode. Exemplary illustrations may include an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor. Furthermore, it is to be understood that one or more of the integrated circuit system could be prepared at one time on a medium, which could be separated into individual or multiple integrated circuit assemblies at a later stage of fabrication.

Referring now to FIG. 1, therein is shown a partial cross sectional view of an integrated circuit system 100 in an initial stage of manufacture in accordance with an embodiment of the present invention. In some embodiments, the integrated circuit system 100 may include an active device 102. In such cases, the active device 102 may more particularly include NFET devices, PFET devices and/or a combination thereof (i.e., CMOS devices), for example. However, it is to be understood that the active device 102 is not limited to the preceding examples and may include any number of multi-electrode devices in which the current flowing between two specified electrodes is controlled or modulated by the voltage applied at a control electrode. Accordingly, although the embodiments described herein are presented for forming doped regions adjacent to and within a single gate structure, the methods may be used to form doped regions adjacent to and within any number of gate structures.

Moreover, it is to be understood that the integrated circuit system 100 manufactured by the embodiments described herein can be used within processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

In some embodiments, the active device 102 can be formed over, on and/or within a substrate 104 by conventional deposition, patterning, photolithography, and etching techniques known in the semiconductor processing industry for the manufacture of active devices. By way of example, the substrate 104 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 104 may also include doped and undoped configurations, epitaxial layers, strained configurations, and one or more crystal orientations (e.g., <100>, <110>, and/or <111> orientations), which may be strategically employed to optimize carrier mobility within NFET and/or PFET devices.

In some embodiments, the substrate 104 may possess a thickness ranging from about one hundred (100) nanometers to about several hundred microns, for example.

However, the examples provided for the substrate 104 are not to be construed as limiting and the composition of the substrate 104 may include any material, configuration, or thickness that physically and electrically enables the formation of active and/or passive device structures.

In general, the active device 102 includes a gate 106, a gate dielectric 108, a channel 110, a liner 112, and a spacer 114, a source/drain extension 116, and a source/drain 118. It will be appreciated by those skilled in the art that the active device 102 at this stage of fabrication may include a fully functioning and operable device that can increase the magnitude of a given electrical input parameter by merely establishing electrical contacts.

In some embodiments, the gate 106 may be formed from conventional materials including doped and undoped semiconducting materials (such as, for example, polySi, amorphous Si, or SiGe), a metal, a metallic alloy, a silicide, or a combination thereof, for example. The gate dielectric 108 may be made from materials including, but not limited to, silicon oxide, silicon oxynitride, silicon nitride, a silicon oxide/nitride/oxide stack, a high-k dielectric material (i.e., one having a dielectric constant value greater than silicon oxide), or a combination thereof. However, it is to be understood that the type of material chosen for the gate dielectric 108 is not limited to the above examples; for example, the gate dielectric 108 may include any material that permits induction of a charge in the channel 110 when an appropriate voltage is applied to the gate 106. Accordingly, other materials, which may be known to those skilled in the art for gate structures, may also be used for the gate 106 and the gate dielectric 108.

Generally, the thickness of the gate 106 can range between about 300 angstroms and about 3000 angstroms and the thickness of the gate dielectric 108 can range between about 5 angstroms and about 50 angstroms. However, larger or smaller thicknesses of the gate 106 and the gate dielectric 108 may be appropriate depending on the design specifications of the active device 102.

The liner 112 can be made from dielectric materials such as an oxide, a nitride, or a combination thereof, but preferably includes silicon dioxide. The liner 112 can be formed by a variety of techniques, including, but not limited to, chemical vapor deposition, physical vapor deposition and thermal oxidation.

In some embodiments, the liner 112 can be formed by oxidation of the gate 106 material, followed by removal of the oxide from over the substrate 104, thereby forming the liner 112. However, it is to be understood that the type of materials and method chosen for the formation of the liner 112 is not limited to the above example and may include any material and method that permits the formation of a gate sidewall structure that electrically isolates the gate 106.

Generally, the liner 112 may include a thickness ranging from about 20 angstroms to about 50 angstroms for a growth process and about 120 angstroms to about 160 angstroms for a deposition process. However, it is to be understood that the thickness of the liner 112 may be smaller or larger and may vary with the design specifications of the active device 102. For example, the thickness of the liner 112 may vary with the desired placement of an optional halo region and/or the source/drain extension 116.

The spacer 114 may also be formed from conventional dielectric materials such as an oxide, a nitride, or a combination thereof, but preferably includes silicon nitride. In general, the spacer 114 is typically formed of a material that can be selectively etched with respect to the material of the liner 112. The spacer 114 can be formed by a variety of techniques, including, but not limited to, chemical vapor deposition and physical vapor deposition.

In some embodiments, the spacer 114 can be formed by deposition of a nitride layer over the gate 106, the liner 112, and adjacent portions of the substrate 104, followed by an anisotropic etch to form the spacer 114 adjacent the liner 112 and the gate 106. However, it is to be understood that the type of materials and method chosen for the formation of the spacer 114 is not limited to the above example and may include any material and method that permits the formation of a gate sidewall structure via moderate etch selectivity.

Generally, the spacer 114 may include a thickness ranging from about 250 angstroms to about 850 angstroms. However, it is to be understood that the thickness of the spacer 114 may be larger or smaller and may vary with the design specifications of the active device 102. For example, the thickness of the spacer 114 may vary with the desired placement of the source/drain extension 116 and/or the source/drain 118.

In other embodiments, the spacer 114 may include any stressor material, such as a stress memorization material/layer, that transfers its inherent or intrinsic stress to the gate 106, the channel 110, the source/drain extension 116, and/or the source/drain 118 during an anneal step. In general, when the spacer 114 includes the characteristics of a stress memorization layer, the spacer 114 can transfer its intrinsic stress to the active device 102 upon recrystallization of the amorphous regions within the active device 102. By way of example, the spacer 114 may include a compressively stressed layer or a tensile stressed layer.

The active device 102 may also include the source/drain extension 116 and the source/drain 118 formed adjacent the gate 106. In general, the source/drain extension 116 may be formed to a shallow depth with a low concentration of impurities relative to the source/drain 118. The impurities used to form the source/drain extension 116 may include n-type or p-type, depending on the active device 102 being formed (e.g., n-type impurities for an NMOS device and p-type impurities for a PMOS device). It is to be understood that the source/drain extension 116 can be formed by aligning the source/drain extension 116 to the gate 106 (i.e., before forming the liner 112 and the spacer 114) or subsequent to forming the liner 112 and the spacer 114 by employing an angled implant.

In some embodiments the source/drain 118 can be aligned to the spacer 114. In general, the source/drain 118 may be of the same conductivity type as the dopants used to form the source/drain extension 116 (e.g., n-type impurities for an NMOS device and p-type impurities for a PMOS device). In general, the source/drain 118 may be formed to a deeper depth and with a higher concentration of impurities (e.g., a heavy dose source and drain implant) relative to the source/drain extension 116.

In yet other embodiments, the implant energy used to form the source/drain 118 may possess sufficient energy to amorphize at least a portion of the substrate 104 and/or at least a portion of the gate 106 of the active device 102. An implant with sufficient energy to amorphize at least a portion of the substrate 104 and/or at least a portion of the gate 106 allows a subsequent anneal step to transfer/memorize a stress to the gate 106 and to the source/drain 118 during recrystallization, thereby promoting stress within the channel 110 and improving the performance of the active device 102.

In yet other embodiments, the source/drain 118 may also include a strained semiconductor material that provides a further increase in the strain upon the channel 110. For example, a strained version of the source/drain 118 could be formed by etching a recess adjacent to the gate 106 and/or the spacer 114, and depositing within that recess a strained silicon/germanium material, which may then provide a significant strain upon the channel 110.

In yet other embodiments, an isolation structure (not shown), such as a shallow trench isolation structure, can electrically isolate and/or separate the active device 102 from other structures. For purposes of illustration, the isolation structure may be made from a dielectric material such as silicon dioxide ("$SiO_2$") and can be formed within the substrate 104.

Figure 2:
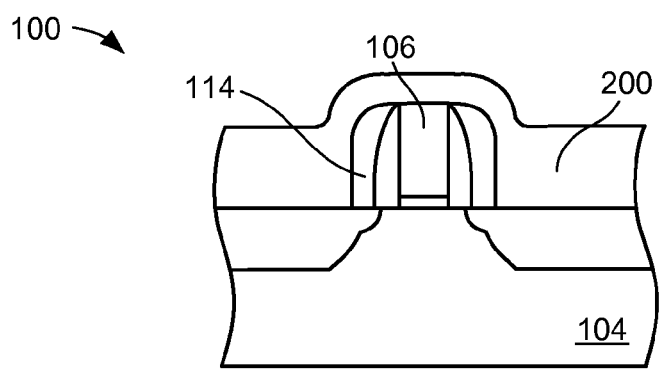
FIG. 2 is the structure of FIG. 1 after forming a material layer.

Referring now to FIG. 2, therein is shown the structure of FIG. 1 after forming a material layer 200. The material layer 200 can be formed over the entirety or on selected portions of the integrated circuit system 100, e.g., blanket deposited over or on the substrate 104, the spacer 114, and the gate 106. In general, the material layer 200 can be formed by a variety of techniques, including, but not limited to, chemical vapor deposition, physical vapor deposition, and/or spin coating.

Generally, the material layer 200 may include any material that permits exposure of the top surface of the gate 106 while protecting the substrate 104 from a subsequent implantation step. More specifically, the material layer 200 can help protect the source/drain 118 from a subsequent gate amorphizing implant that typically causes sever end-of-range error damage to the source and drain junctions.

In other embodiments, the material layer 200 may be formed of a material that can be selectively etched with respect to the gate 106. By forming the material layer 200 from a material that possesses a differential etch characteristic with respect to the gate 106, damage to the gate 106 can be diminished or prevented during the removal of the material layer 200. In other embodiments, the material layer 200 may more specifically include an organic compound, such as a polymer solution in an organic solvent, commonly referred to as a resist or photoresist. In such cases, the material layer 200 can be easily deposited by common spin coating equipment.

In general, the material layer 200 may have a thickness ranging from about 100 angstroms to about 1000 angstroms. However, larger or smaller thicknesses may be employed depending upon the design specifications of the integrated circuit system 100.

Figure 3:
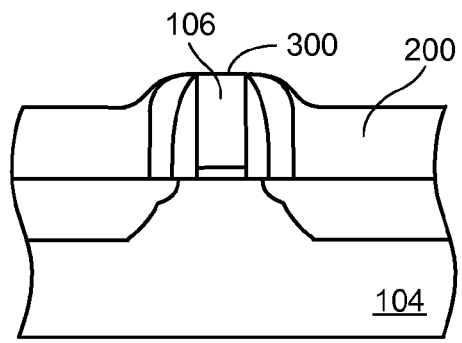
FIG. 3 is the structure of FIG. 2 after processing a material layer.

Referring now to FIG. 3, therein is shown the structure of FIG. 2 after processing the material layer 200. In general, the material layer 200 is processed by etching back the material layer 200 to expose a gate top surface 300 of the gate 106, while leaving remaining portions of the material layer 200 formed over the substrate 104. The remaining portions of the material layer 200 protect the substrate 104 from damage that may occur during a subsequent implant. By way of example, the material layer 200 can be etched back to expose the gate top surface 300 by a multitude of processes including, but not limited to, wet etching, dry etching, patterned etching, unpatterned etching, and/or chemical mechanical planarization processes. In some embodiments, the material layer 200 can also be etched back by an anisotropic resist removal process. It is to be understood that the exposure of the gate top surface 300 could be used as the end-point detector of the etchback process.

Figure 4:
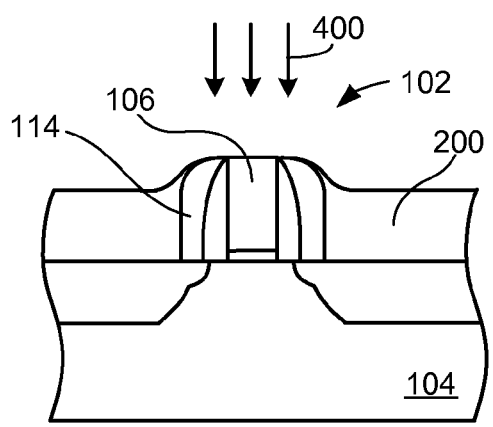
FIG. 4 is the structure of FIG. 3 during implantation of a gate.

Referring now to FIG. 4, therein is shown the structure of FIG. 3 during implantation of the gate 106. Generally, the present embodiment employs a dopant that will increase the grain size of the material used for the gate 106 by utilizing an implant (depicted by arrows 400) that will amorphize between about five (5) percent and about ninety-five (95) percent of the gate 106 material. The present inventors have discovered that by selectively employing a strategically engineered doping process (i.e., a doping process that increases the grain size of the gate 106) that the $Id_{sat}$ or $I_{on}$ current of the active device 102 can be increased upon the application of a stress memorization transfer anneal. For example, in some embodiments, it has been discovered that the $Id_{sat}$ of the active device 102 can be increased by about eleven (11) percent over that of a control device when performing the processes described herein. Notably, this increase in the drive current of the active device 102 occurs without an increase in the leakage current of the active device 102.

Generally, the dopant implanted within the gate 106 may include any element or compound that increases the grain size (e.g., after annealing) of the material chosen for the gate 106. By way of example, in some embodiments, the dopant may include antimony, indium, germanium or a germanium including compound implanted via one or more angled and/or perpendicular implantation process techniques. In such cases, the germanium implant may include an implantation energy between about 20 keV and about 200 keV and a dose above about $5 \times 10^{14}$ ions/cm$^2$. However, larger or smaller energies and doses may be used depending upon the desired design specifications of the active device 102.

For example, the present inventors have discovered that by employing germanium doses above about $2 \times 10^{16}$ ions/cm$^2$ that the grain size of the gate 106 can be increased by about 10 times as compared to that of a gate implanted with a dose of about $2 \times 10^{15}$ ions/cm$^2$ and below. This increase in grain size is particularly advantageous for subsequent stress memorization transfer techniques, wherein the increase in grain size of a material exhibits a positive correlation with the increase of $Id_{sat}$ upon recrystallization via a stress memorization transfer anneal.

It will be appreciated by those skilled in the art that the planarization or etchback process of the present embodiment can provide a smoother global and/or local surface for improved implantation of the dopant into the gate 106, thereby improving the quality, reproducibility and uniformity of the implantation process within the gate 106. Additionally, such processing techniques help to eliminate the disadvantageous occurrences of shadowing and dopant scattering that are common to recessed etched implanted structures. Moreover, it has been discovered that the processes and structures described herein permit a substantial expansion in the volume of the gate 106, thereby allowing more stress to be transferred by a subsequently deposited stress memorization layer.

Subsequent to implanting the gate 106 with the grain size enlarging and/or amorphizing dopant material, the material layer 200 can be removed to expose the spacer 114 and the substrate 104. By way of example, the material layer 200 can be removed by a multitude of processes including, but not limited to, wet etching and/or dry etching.

Figure 5:
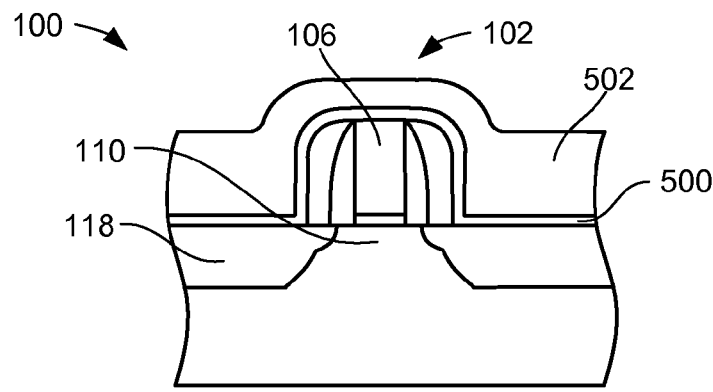
FIG. 5 is the structure of FIG. 4 after deposition of a layer and a dielectric layer.

Referring now to FIG. 5, therein is shown the structure of FIG. 4 after deposition of a layer 500 and a dielectric layer 502. The layer 500 can be formed over the entirety or on selected portions of the integrated circuit system 100. In some embodiments, the layer 500 includes an insulating material such as an oxide grown by wet or dry oxidation techniques and may act as a boundary layer between the dielectric layer 502 and previously deposited layers. In other embodiments, the layer 500 may include an oxide deposited by chemical vapor deposition techniques. In yet other embodiments, the layer 500 may include a low temperature oxide film deposited by reacting silane with either oxygen, nitrous oxide, or carbon dioxide at temperatures below about 800° C. in a plasma. In still yet other embodiments, the layer 500 may include any oxide that is deposited using temperatures, pressures, and reactants to maximize the intrinsic compressive or tensile stress within the layer 500. In general, when the layer 500 includes the characteristics of a stress memorization layer, the layer 500 can transfer its intrinsic stress to the active device 102 upon recrystallization of the amorphous regions within the active device 102.

By way of example, the layer 500 may have a thickness ranging from about 50 angstroms to about 300 angstroms.

Subsequent to forming the layer 500, the dielectric layer 502 can be formed over or on the layer 500. In some embodiments, the dielectric layer 502 includes an insulating material such as a nitride deposited by low pressure chemical vapor deposition (LPCVD) or plasma enhanced chemical vapor deposition (PECVD). In other embodiments, the dielectric layer 502 may include a silicon nitride film deposited by rapid thermal chemical vapor deposition (RTCVD).

In yet other embodiments, the dielectric layer 502 may also include any stressor material, such as a stress memorization material/layer, that transfers its inherent or intrinsic stress to the gate 106, the channel 110, and/or the source/drain 118 of the active device 102 during an anneal step. In general, when the dielectric layer 502 includes the characteristics of a stress memorization layer, the dielectric layer 502 can transfer its intrinsic stress to the active device 102 upon recrystallization of the amorphous regions within the active device 102. By way of example, the dielectric layer 502 may include a compressively stressed layer or a tensile stressed layer.

It is to be understood that the stress induced within the active device 102 by the layer 500 and the dielectric layer 502 can be increased by increasing the intrinsic stress within the layer 500 and the dielectric layer 502. For example, a multitude of deposition parameters, such as reactant flow rates, pressure, temperature, RF power, reactant materials, and thickness, can be adjusted to modulate the intrinsic stress within each of the layer 500 and the dielectric layer 502 and thereby maximize their stress transference effect upon the active device 102 during annealing.

In general, the dielectric layer 502 may have a thickness ranging from about 200 angstroms to about 1200 angstroms.

Figure 6:
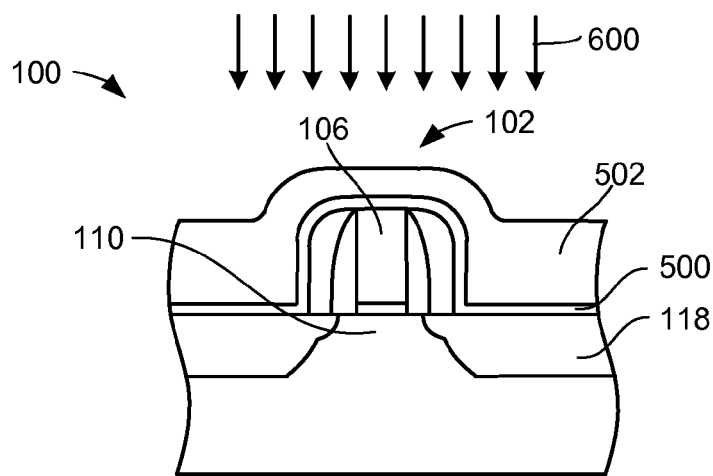
FIG. 6 is the structure of FIG. 5 during an anneal.

Referring now to FIG. 6, therein is shown the structure of FIG. 5 during an anneal. Subsequent to forming the layer 500 and the dielectric layer 502, an anneal step (depicted by arrows 600) is performed to electrically activate the dopants and recrystallize the amorphous regions within the active device 102. As previously explained, the preceding implantation processes used to form the source/drain 118 and the amorphous region within the gate 106 may have created a high degree of lattice damage within these portions of the active device 102. Accordingly, during the anneal process, the corresponding damaged and amorphous lattice portions can be re-grown, wherein, due to the presence of the layer 500 and the dielectric layer 502 above the active device 102, the activation and recrystallization process can result in a strained or stressed portion in the source/drain 118 and the gate 106. It will be appreciated by those skilled in the art that such a stress memorization transfer process can induce strain within the channel 110, thereby improving the carrier mobility of the integrated circuit system 100.

It is to be understood that the anneal step of the present embodiment transfers the intrinsic stress from within the layer 500 and the dielectric layer 502 into the gate 106 and/or the source/drain 118 of the active device 102. After annealing with the layer 500 and the dielectric layer 502 formed over the active device 102, each of the gate 106, the channel 110 and/or the source/drain 118 of the active device 102 can be described as exhibiting the characteristics of stress memorization (i.e., their physical properties have been affected by the layer 500 and the dielectric layer 502). For example, the gate 106, the channel 110 and/or the source/drain 118 may exhibit a tensile stressed nature or a compressive stressed nature.

The present invention achieves stress memorization transfer by annealing the integrated circuit system 100 with a temperature sufficiently high enough to cause recrystallization of the amorphous and/or lattice damaged regions (e.g., due to previous implantations) located within the gate 106 and/or the source/drain 118. Accordingly, the stress from the layer 500 and the dielectric layer 502 can be retained within the gate 106 and/or the source/drain 118 through the recrystallization anneal.

Not wishing to be limited to any particular theory, the present inventors believe that during annealing, the amorphous and/or lattice damaged regions located within the gate 106 and/or the source/drain 118 recrystallize under a field of stress induced by the layer 500 and the dielectric layer 502. The field of stress induced by the layer 500 and the dielectric layer 502 are believed to cause the atoms of the gate 106 and/or the source/drain 118 to align or crystallize with a compressively stressed lattice constant or a tensile stressed lattice constant.

As such, the stress transferred by the layer 500 and the dielectric layer 502 into the gate 106 and/or the source/drain 118 improves the carrier mobility of the integrated circuit system 100. The carrier mobility of the integrated circuit system 100 is improved because the recrystallized stressed regions of the gate 106 and/or the source/drain 118 induce stress within the channel 110, thereby improving carrier mobility.

It is to be understood that the anneal of the present invention may include any thermal process that causes the amorphous and/or lattice damaged regions of the gate 106 and/or the source/drain 118 to recrystallize under the stress of, and retain the stress of, the layer 500 and the dielectric layer 502. As exemplary illustrations, the anneal may include a rapid thermal anneal, a spike anneal, a laser anneal, and/or a low temperature anneal followed by a laser based or flash based anneal. It will be appreciated by those skilled in the art that such above described anneal processes may help to reduce or suppress unwanted diffusion of the dopant species during the anneal.

Moreover, it will be appreciated by those skilled in the art that the remainder of the integrated circuit system 100 can then be completed by conventional manufacturing strategies, which may include, but are not limited to, removal of the layer 500 and the dielectric layer 502, formation of low resistance electrical contacts (e.g., silicide electrical contacts) over the gate 106 and the source/drain 118, and the formation of an additional stressed overlayer, such as one or more contact etch stop layers.

Referring now to FIGS. 7-12. FIGS. 7-12 include some of the same reference numbers used to describe the integrated circuit system 100 in FIGS. 1-6 and the process steps of FIGS. 1-6. It is noted that the layers, structures, and process steps corresponding to such reference numbers generally include the same characteristics (e.g., composition, thickness, function, process techniques, etc.) as those described in reference to FIGS. 1-6 and, therefore, their descriptions are not reiterated in detail for FIGS. 7-12. Rather the descriptions of the layers, structures, and process steps corresponding to reference numbers in FIGS. 1-6 are incorporated for the same reference numbers included in FIGS. 7-12.

Figure 7:
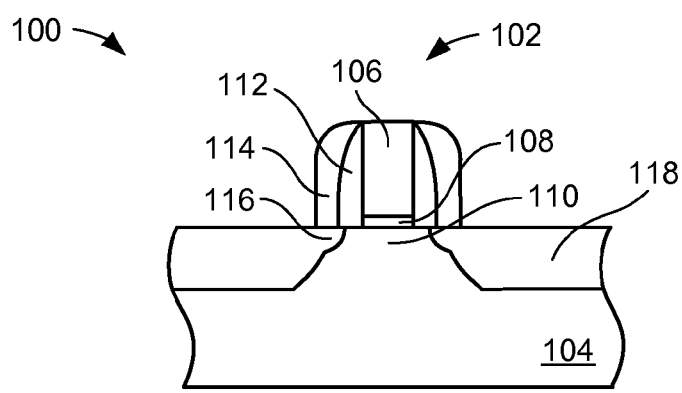
FIG. 7 is a partial cross sectional view of an integrated circuit system in an initial stage of manufacture in accordance with another embodiment of the present invention.

Referring now to FIG. 7, therein is shown a partial cross sectional view of the integrated circuit system 100 in an initial stage of manufacture in accordance with another embodiment of the present invention. The integrated circuit system 100 may include the active region 102, the substrate 104, the gate 106, the gate dielectric 108, the channel 110, the liner 112, the spacer 114, the source/drain extension 116, and the source/drain 118. It is to be understood that the substrate 104, the gate 106, the gate dielectric 108, the channel 110, the liner 112, the spacer 114, the source/drain extension 116, and the source/drain 118 may include any of the characteristics, such as material composition, thickness, and process techniques, described above in regard to FIG. 1.

Moreover, it will be appreciated by those skilled in the art that the active device 102 at this stage of fabrication may include a fully functioning and operable device that can increase the magnitude of a given electrical input parameter by merely establishing electrical contacts.

Figure 8:
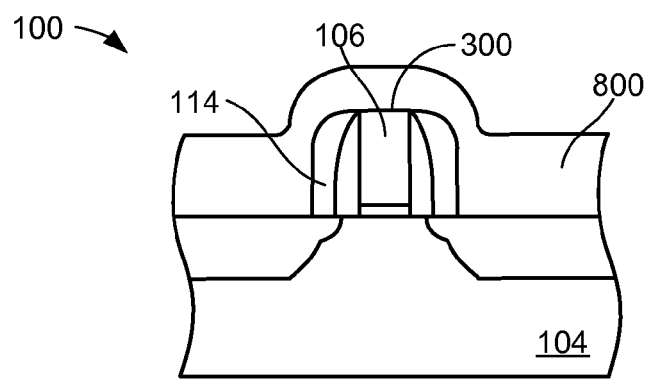
FIG. 8 is the structure of FIG. 7 after forming a material layer.

Referring now to FIG. 8, therein is shown the structure of FIG. 7 after forming a material layer 800. The material layer 800 can be formed over the entirety or on selected portions of the integrated circuit system 100, e.g., blanket deposited over or on the substrate 104, the spacer 114, and the gate 106. In general, the material layer 800 can be formed by a variety of techniques, including, but not limited to, chemical vapor deposition, physical vapor deposition, and/or thermal oxidation.

Generally, the material layer 800 may include any material that permits exposure of the gate top surface 300 while protecting the substrate 104 from a subsequent implantation step. More specifically, the material layer 800 can help protect the source/drain 118 from a subsequent gate amorphizing implant that typically causes sever end-of-range error damage to the source and drain junctions.

In other embodiments, the material layer 800 may be formed of a material that can be selectively etched with respect to the gate 106. By forming the material layer 800 from a material that possesses a differential etch characteristic with respect to the gate 106, damage to the gate 106 can be diminished or prevented during the removal of the material layer 800. In other embodiments, the material layer 800 may include an insulating material such as an oxide grown by wet or dry oxidation techniques. In yet other embodiments, the material layer 800 may include an oxide deposited by chemical vapor deposition techniques. In still yet other embodiments, the material layer 800 may include a low temperature oxide film deposited by reacting silane with either oxygen, nitrous oxide, or carbon dioxide at temperatures below about 800° C. in a plasma. However, it is to be understood that the above examples are not limiting and those skilled in the art will appreciate that additional materials and/or process techniques may also be employed/manipulated to effectuate the purpose of forming the material layer 800 to help protect the substrate 104 from subsequent implantation steps.

In general, the material layer 800 may have a thickness ranging from about 200 angstroms to about 1200 angstroms. However, larger or smaller thicknesses may be employed depending upon the design specifications of the integrated circuit system 100.

Figure 9:
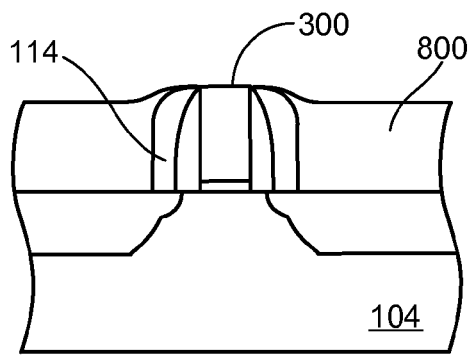
FIG. 9 is the structure of FIG. 8 after processing a material layer.

Referring now to FIG. 9, therein is shown the structure of FIG. 8 after processing the material layer 800. In general, the material layer 800 is processed by etching back the material layer 800 to expose the gate top surface 300, while leaving remaining portions of the material layer 800 formed over the substrate 104 and the spacer 114. The remaining portions of the material layer 800 protect the substrate 104 from damage that may occur during a subsequent implant. By way of example, the material layer 800 can be etched back to expose the gate top surface 300 by a multitude of processes including, but not limited to, wet etching, dry etching, patterned etching, unpatterned etching, and/or chemical mechanical planarization processes. It is to be understood that the exposure of the gate top surface 300 could be used as the end-point detector of the etchback process.

Figure 10:
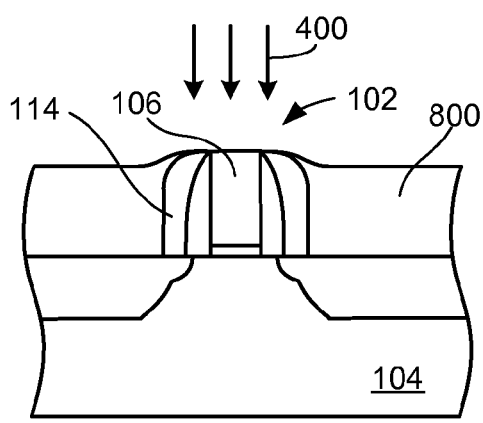
FIG. 10 is the structure of FIG. 9 during implantation of a gate.

Referring now to FIG. 10, therein is shown the structure of FIG. 9 during implantation of the gate 106. Generally, the present embodiment employs a dopant that will increase the grain size of the material used for the gate 106 by utilizing an implant (depicted by arrows 400) that will amorphize between about five (5) percent and about ninety-five (95) percent of the gate 106 material. The present inventors have discovered that by selectively employing a strategically engineered doping process (i.e., a doping process that increases the grain size of the gate 106) that the $Id_{sat}$ or $I_{on}$ current of the active device 102 can be increased upon the application of a stress memorization transfer anneal. For example, in some embodiments, it has been discovered that the $Id_{sat}$ of the active device 102 can be increased by about eleven (11) percent over that of a control device when performing the processes described herein. Notably, this increase in the drive current of the active device 102 occurs without an increase in the leakage current of the active device 102.

Generally, the dopant implanted within the gate 106 may include any element or compound that increases the grain size (e.g., after annealing) of the material chosen for the gate 106. By way of example, in some embodiments, the dopant may include antimony, indium, germanium or a germanium including compound implanted via one or more angled and/or perpendicular implantation process techniques. In such cases, the germanium implant may include an implantation energy between about 20 keV and about 200 keV and a dose above about $5 \times 10^{14}$ ions/cm$^2$. However, larger or smaller energies and doses may be used depending upon the desired design specifications of the active device 102.

For example, the present inventors have discovered that by employing germanium doses above about $2 \times 10^{16}$ ions/cm$^2$ that the grain size of the gate 106 can be increased by about 10 times as compared to that of a gate implanted with a dose of about $2 \times 10^{15}$ ions/cm$^2$ and below. This increase in grain size is particularly advantageous for subsequent stress memorization transfer techniques, wherein the increase in grain size of a material exhibits a positive correlation with the increase of $Id_{sat}$ upon recrystallization via a stress memorization transfer anneal.

It will be appreciated by those skilled in the art that the planarization or etchback process of the present embodiment can provide a smoother global and/or local surface for improved implantation of the dopant into the gate 106, thereby improving the quality, reproducibility and uniformity of the implantation process within the gate 106. Additionally, such processing techniques help to eliminate the disadvantageous occurrences of shadowing and dopant scattering that are common to recessed etched implanted structures. Moreover, it has been discovered that the processes and structures described herein permit a substantial expansion in the volume of the gate 106, thereby allowing more stress to be transferred by a subsequently deposited stress memorization layer.

Subsequent to implanting the gate 106 with the grain size enlarging and/or amorphizing dopant material, the material layer 800 can be removed to expose the spacer 114 and the substrate 104. By way of example, the material layer 800 can be removed by a multitude of processes including, but not limited to, wet etching (e.g., hydrofluoric acid or a buffered oxide etch) and/or dry etching, Referring now to FIG. 11, therein is shown the structure of FIG. 10 after deposition of a dielectric layer 1100. The dielectric layer 1100 can be formed over the entirety or on selected portions of the integrated circuit system 100. In some embodiments, the dielectric layer 1100 includes an insulating material such as a nitride deposited by low pressure chemical vapor deposition (LPCVD) or plasma enhanced chemical vapor deposition (PECVD). In other embodiments, the dielectric layer 1100 may include a silicon nitride film deposited by rapid thermal chemical vapor deposition (RTCVD).

In yet other embodiments, the dielectric layer 1100 may also include any stressor material, such as a stress memorization material/layer, that transfers its inherent or intrinsic stress to the gate 106, the channel 110, and/or the source/drain 118 of the active device 102 during an anneal step. In general, when the dielectric layer 1100 includes the characteristics of a stress memorization layer, the dielectric layer 1100 can transfer its intrinsic stress to the active device 102 upon recrystallization of the amorphous regions within the active device 102. By way of example, the dielectric layer 1100 may include a compressively stressed layer or a tensile stressed layer.

It is to be understood that the stress induced within the active device 102 by the dielectric layer 1100 can be increased by increasing the intrinsic stress within the dielectric layer 1100. For example, a multitude of deposition parameters, such as reactant flow rates, pressure, temperature, RF power, reactant materials, and thickness, can be adjusted to modulate the intrinsic stress within the dielectric layer 1100 and thereby maximize its stress transference effect upon the active device 102.

In general, the dielectric layer 1100 may have a thickness ranging from about 200 angstroms to about 1500 angstroms.

Figure 11:
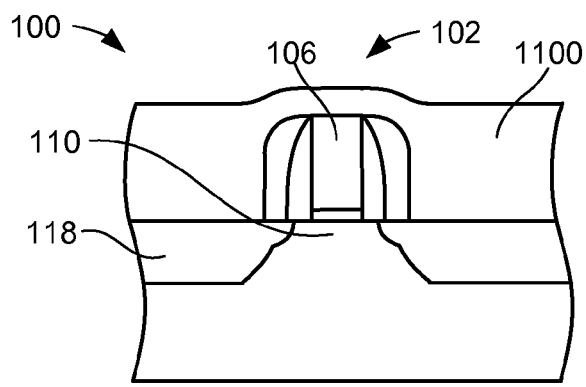
FIG. 11 is the structure of FIG. 10 after deposition of a dielectric layer.
Figure 12:
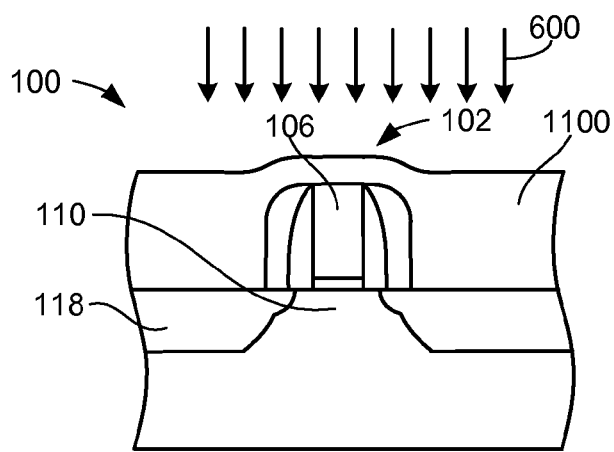
FIG. 12 is the structure of FIG. 11 during an anneal.

Referring now to FIG. 12, therein is shown the structure of FIG. 11 during an anneal. Subsequent to forming the dielectric layer 1100, an anneal step (depicted by arrows 600) is performed to electrically activate the dopants and recrystallize the amorphous regions within the active device 102. As previously explained, the preceding implantation processes used to form the source/drain 118 and the amorphous region within the gate 106 may have created a high degree of lattice damage within these portions of the active device 102. Accordingly, during the anneal process, the corresponding damaged and amorphous lattice portions can be re-grown, wherein, due to the presence of the dielectric layer 1100 above the active device 102, the activation and recrystallization process can result in a strained or stressed portion in the source/drain 118 and the gate 106. It will be appreciated by those skilled in the art that such a stress memorization transfer process can induce strain within the channel 110, thereby improving the carrier mobility of the integrated circuit system 100.

It is to be understood that the anneal step of the present embodiment transfers the intrinsic stress from within the dielectric layer 1100 into the gate 106 and/or the source/drain 118 of the active device 102. After annealing with dielectric layer 1100 formed over the active device 102, each of the gate 106, the channel 110 and/or the source/drain 118 of the active device 102 can be described as exhibiting the characteristics of stress memorization (i.e., their physical properties have been affected by the dielectric layer 1100). For example, the gate 106, the channel 110 and/or the source/drain 118 may exhibit a tensile stressed nature or a compressive stressed nature.

The present invention achieves stress memorization transfer by annealing the integrated circuit system 100 with a temperature sufficiently high enough to cause recrystallization of amorphous and/or lattice damaged regions (e.g., due to previous implantations) located within the gate 106 and/or the source/drain 118. Accordingly, the stress from the dielectric layer 1100 can be retained within the gate 106 and/or the source/drain 118 through the recrystallization anneal.

Not wishing to be limited to any particular theory, the present inventors believe that during annealing, the amorphous and/or lattice damaged regions located within the gate 106 and/or the source/drain 118 are recrystallized under a field of stress induced by the dielectric layer 1100. The field of stress induced by the dielectric layer 1100 is believed to cause the atoms of the gate 106 and/or the source/drain 118 to align or crystallize with a compressively stressed lattice constant or a tensile stressed lattice constant.

As such, the stress transferred by the dielectric layer 1100 into the gate 106 and/or the source/drain 118 improves the carrier mobility of the integrated circuit system 100. The carrier mobility of the integrated circuit system 100 is improved because the recrystallized stressed regions of the gate 106 and/or the source/drain 118 induce stress within the channel 110, thereby improving carrier mobility.

It is to be understood that the anneal of the present invention may include any thermal process that causes the amorphous and/or lattice damaged regions of the gate 106 and/or the source/drain 118 to recrystallize under the stress of, and retain the stress of, the dielectric layer 1100. As exemplary illustrations, the anneal may include a rapid thermal anneal, a spike anneal, a laser anneal, and/or a low temperature anneal followed by a laser based or flash based anneal. It will be appreciated by those skilled in the art that such above described anneal processes may help to reduce or suppress unwanted diffusion of the dopant species during the anneal.

Moreover, it will be appreciated by those skilled in the art that the remainder of the integrated circuit system 100 can then be completed by conventional manufacturing strategies, which may include, but are not limited to, removal of the dielectric layer 11100, formation of low resistance electrical contacts (e.g., silicide electrical contacts) over the gate 106 and the source/drain 118, and the formation of an additional stressed overlayer, such as one or more contact etch stop layers.

Figure 13:
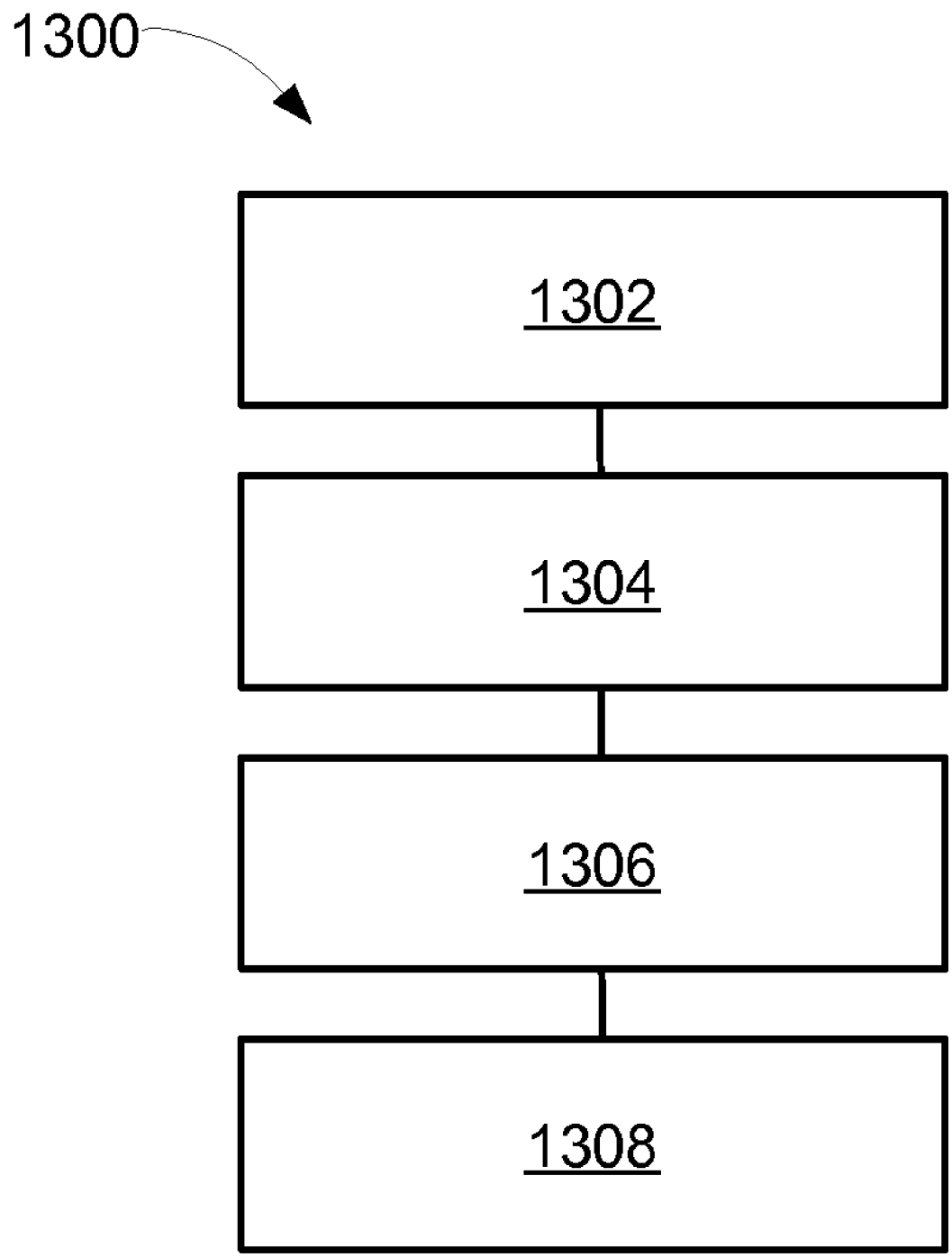
FIG. 13 is a flow chart of an integrated circuit system for an integrated circuit system in accordance with an embodiment of the present invention.

Referring now to FIG. 13, therein is shown a flow chart of an integrated circuit system 1300 for the integrated circuit system 100 in accordance with an embodiment of the present invention. The integrated circuit system 1300 includes providing a substrate including an active device with a gate top surface exposed in a block 1302; implanting a dopant within the gate to alter the grain size of the gate material in a block 1304; forming a dielectric layer over the active device and the substrate in a block 1306; and annealing the integrated circuit system to transfer the stress of the dielectric layer into the active device in a block 108.

It has been discovered that the present invention thus has numerous aspects. One such aspect is that the present invention can alter the grain size of a gate material by utilizing a high dose (e.g., above about $5 \times 10^{14}$ ions/cm$^2$) germanium implant. Notably, the present embodiments achieve this by minimizing and simplifying the process steps.

Another aspect is that the present invention prevents damage to the substrate (e.g., the source and drain regions of the active device) by protecting the substrate with a material layer that helps to block a subsequent grain enlarging/amorphizing implant. Typically, if a high germanium implant is incorporated into a conventional stress memorization transfer process flow, it causes severe end-of-range error damage to the source/drain junctions after annealing. These defects can lead to significant junction leakage within an active device structure.

Another aspect is that the present invention can improve the performance of an active device by combining the selective grain size altering implant of the gate with a stress memorization transfer process that can increase the $I_{on}$ current of an active device without affecting the leakage current of the active device.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for enhancing active device performance. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a substrate including an active device with a gate top surface exposed;
   growing beyond the initial grain size of the gate material by implantation of a dopant within the gate material;
   forming a dielectric layer over the active device and the substrate; and
   annealing the integrated circuit system to transfer the stress of the dielectric layer into the active device.

2. The method as claimed in claim 1 wherein:
   implanting the dopant includes using a dopant dose above about $2 \times 10^{16}$ ions/cm$^2$.

3. The method as claimed in claim 1 wherein:
   implanting the dopant includes implanting germanium, antimony, or indium.

4. The method as claimed in claim 1 wherein:
   forming the dielectric layer includes forming a tensile stressed layer or a compressive stressed layer.

5. The method as claimed in claim 1 wherein:
   annealing the integrated circuit system includes creating stress within a channel of the active device that alters carrier mobility within the channel.

6. A method of manufacture of an integrated circuit system comprising:
   providing a substrate including an active device;
   forming a material layer over the active device and the substrate;
   processing the material layer to expose a gate top surface;
   growing beyond the initial grain size of the gate material by implantation of a dopant within the gate material;
   forming a dielectric layer over the active device and the substrate; and
   annealing the integrated circuit system to transfer the stress of the dielectric layer into the active device.

7. The method as claimed in claim 6 wherein:
   forming the material layer includes forming a resist layer or an oxide layer.

8. The method as claimed in claim 6 wherein:
   foaming the material layer protects the substrate from the implantation of the dopant.

9. The method as claimed in claim 6 wherein:
   processing the material layer includes an etchback or planarization process that utilizes the gate top surface for end point detection.

10. The method as claimed in claim 6 wherein:
    implanting the dopant includes an implantation process with a sufficient energy and dose to amorphize and enlarge the grain size of the gate material.

11. A method of manufacture of an integrated circuit system comprising:
    providing a substrate including an active device;
    forming a material layer over the active device and the substrate;
    processing the material layer to expose a gate top surface;
    growing beyond the initial grain size of the gate material by implantation of germanium within the gate material;
    forming a dielectric layer over the active device and the substrate; and
    annealing the integrated circuit system to transfer the stress of the dielectric layer into the active device.

12. The method as claimed in claim 11 wherein:
    implanting germanium includes using a germanium dose sufficient to alter the drive current of the active device.

13. The method as claimed in claim 11 wherein:
    implanting germanium includes using a germanium dose above about $2 \times 10^{16}$ ions/cm$^2$.

14. The method as claimed in claim 11 wherein:
    forming the dielectric layer includes forming a tensile stressed layer or a compressive stressed layer.

15. The method as claimed in claim 11 wherein:
    annealing the integrated circuit system includes creating stress within a channel of the active device that alters carrier mobility within the channel.

16. The method as claimed in claim 11 wherein:
    forming the material layer includes forming a resist layer or an oxide layer.

17. The method as claimed in claim 11 wherein:
    forming the material layer protects the substrate from the implantation of germanium.

18. The method as claimed in claim 11 wherein:
    processing the material layer includes an etchback or planarization process that utilizes the gate top surface for end point detection.

19. The method as claimed in claim 11 wherein:
    implanting germanium includes implanting with a sufficient energy and dose to amorphize and enlarge the grain size of the gate material.

20. The method as claimed in claim 11 wherein:
    providing the active device includes providing an n-channel field effect transistor.

* * * * *